(12) United States Patent
Nogi

(10) Patent No.: US 6,331,795 B1
(45) Date of Patent: Dec. 18, 2001

(54) LOCK DETERMINATION CIRCUIT OF PLL FOR PULLING UP INTERMEDIATE ELECTRIC POTENTIAL OF LOCK DETERMINATION GATE

(75) Inventor: Kenichi Nogi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/461,411

(22) Filed: Dec. 16, 1999

(30) Foreign Application Priority Data

Dec. 21, 1998 (JP) .................................................. 10-363576

(51) Int. Cl.⁷ ....................................................... H03L 7/06
(52) U.S. Cl. ............................ 327/156; 327/159; 327/147
(58) Field of Search ..................................... 327/156, 159, 327/20, 41, 147, 12

(56) References Cited

U.S. PATENT DOCUMENTS 5,256,989 * 10/1993 Parker et al. .......................... 331/1 A
5,724,007 * 3/1998 Mar ........................................ 331/1 A
5,783,956 * 7/1998 Ooishi .................................... 327/157
5,870,002 * 2/1999 Ghaderi et al. ......................... 331/17

FOREIGN PATENT DOCUMENTS 0 484 097   5/1992   (EP) .
56-86528    7/1981   (JP) .
4-29411     1/1992   (JP) .
7-30416     1/1995   (JP) .
7-326969   12/1995   (JP) .
10-98376    4/1998   (JP) .

OTHER PUBLICATIONS

"Monolithischer CMOS–Phase–Locked–Loop–IC". IN: Designbook 81, 1981, S. 34–36.

* cited by examiner

*Primary Examiner*—Toan Tran
*Assistant Examiner*—Cassandra Cox
(74) *Attorney, Agent, or Firm*—McGuireWoods, LLP

(57) ABSTRACT

A lock determination circuit raises the electric potential of the input of a lock determination gate after the lock state is determined, thereby reducing (the period of) the current flowing through the lock determination gate. In the circuit, the input level of the lock determination gate is forcibly pulled up immediately after the lock state is determined, so as to reduce the current flowing through the lock determination gate. A pull-up transistor and a delay circuit may be used, wherein the delay circuit is activated when the lock state is determined, and the pull-up operation is performed by setting the pull-up transistor to the ON state for a predetermined period by using the delay circuit.

3 Claims, 5 Drawing Sheets

LOCK DETERMINATION CIRCUIT OF PLL FOR PULLING UP INTERMEDIATE ELECTRIC POTENTIAL OF LOCK DETERMINATION GATE

BACKGROUND OF THE INVENTION

1. Field of the Invention

The present invention relates to a lock determination circuit of a PLL (phase-locked loop), and in particular, a circuit for reducing power consumption of a PLL.

This application is based on patent application No. Hei 10-363576 filed in Japan, the contents of which are incorporated herein by reference.

2. Description of the Related Art

FIG. 5 is a circuit diagram showing the structure of a conventional lock determination circuit of a PLL.

As shown in the figure, such a determination circuit compares two output signals, "Up" and "Down", from a phase and frequency detector Det so as to output a signal for controlling a pull-down transistor "Tr.A", so that the analog potential of Node 1 (see FIG. 5) can be changed.

In operation, the electric potential of Node 1 is gradually changed by suitably selecting the time constant determined by resistances R51 and R52 and capacitance C51.

Generally, the PLL has a function of comparing a reference clock (signal) and a comparison (i.e., feedback) clock (signal) so as to synchronize the comparison (feedback) clock with the reference clock. In addition, the PLL includes a loop filter for smoothing the detection pulse signal from the phase and frequency detector and outputting an oscillator control signal, and also includes a voltage controlled oscillator for outputting a clock signal having a predetermined frequency, by using the oscillator control signal.

In the above function the PLL, when the power supply is activated or when the reference clock is changed, a time lag is present until the lock state is realized. Therefore, in this process, it is necessary to employ a signal for monitoring the lock and unlock states, and generally, such a lock-state determining signal is controlled using an output from the phase and frequency detector.

Here, the phase and frequency detector detects the frequency/phase difference between the reference clock and comparison (feedback) clock, and outputs the detected result using the Up and Down signals.

When a frequency/phase difference exists, one of the Up and Down signals maintains the High level during a period corresponding to the difference; thus, transistor "Tr.A" is repeatedly switched to the ON state and to the OFF state in turn.

When transistor "Tr.A" is in the ON state, the electric potential of Node 1 falls with the RC time constant: R51× C51, while when transistor "Tr.A" is in the OFF state, the electric potential of Node 1 rises with the RC time constant: R52×C51.

As the lock state approaches, the High-level state of the Up/Down signal is observed sporadically and thus the Off-state period of the transistor "Tr.A" becomes longer.

When the duration of the Off state of the transistor "Tr.A" exceeds the time "R52×C51", then the electric potential of Node 1 gradually rises. When this electric potential becomes Vdd/2, then at last the output level of the Lock terminal (see FIG. 5) becomes High.

After the Lock terminal becomes High and thus the lock state is determined, the electric potential of Node 1 still gradually rises towards the level Vdd, that is, Node 1 has an intermediate potential for a while.

In the above method related to FIG. 5, when Node 1 has such an intermediate potential before and after the lock determination timing, a current flows for a period through the gate which is driven by the intermediate potential, thereby consuming power.

SUMMARY OF THE INVENTION

In consideration of the above circumstances, an objective of the present invention is to provide a lock determination circuit of a PLL, in which the electric potential of Node 1 (the lock determination gate) can be stabilized by raising the node potential immediately after the lock determination, thereby reducing the period during which the current flows through the relevant gate and thus reducing the power consumption.

Therefore, the present invention provides a lock determination circuit of a PLL (phase-locked loop), wherein:

the PLL comprises a phase and frequency detector for comparing a reference signal and a comparison signal and outputting a detection pulse signal according to a difference between the reference and comparison signals; and the lock determination circuit determines the lock state of an input signal to the PLL based on the detection pulse signal, and comprises:

a lock determination gate whose input level has an intermediate electric potential for a period after the lock state is determined; and pull-up means for forcibly pulling up the input level of the lock determination gate immediately after the lock state is determined, so as to reduce a current flowing through the lock determination gate.

In the above structure, the pull-up means may include a pull-up transistor and a delay circuit, wherein:

the delay circuit is activated when the lock state is determined; and the operation of pulling up the input level of the lock determination gate is performed by setting the pull-up transistor to the ON state for a predetermined period by using the delay circuit.

It is also possible, in the above structure, for the pull-up means to include a first delay circuit activated when the lock state is determined and a latch, and the input level of the lock determination gate is pulled up for a predetermined period by using the first delay circuit and the latch, and the lock determination circuit further comprises:

pull-down means including a second delay circuit activated when the unlock state is determined and a latch, wherein the input level of the lock determination gate is pulled down for a predetermined period by using the second delay circuit and the latch.

According to the present invention, the electric potential of the relevant node (i.e., the input of the lock determination gate) having an intermediate potential can be raised after the lock determination to Vdd by using a pull-up transistor, latch, or the like, and can be lowered, after the unlock determination, to the ground level. Therefore, the current flowing through the lock determination gate such as an inverter (connected to the above node) can be reduced, thereby reducing the power consumption.

DESCRIPTION OF THE PREFERRED EMBODIMENTS

Hereinafter, embodiments of the lock determination circuit of a PLL according to the present invention will be explained with reference to the drawings.

Figure 1:
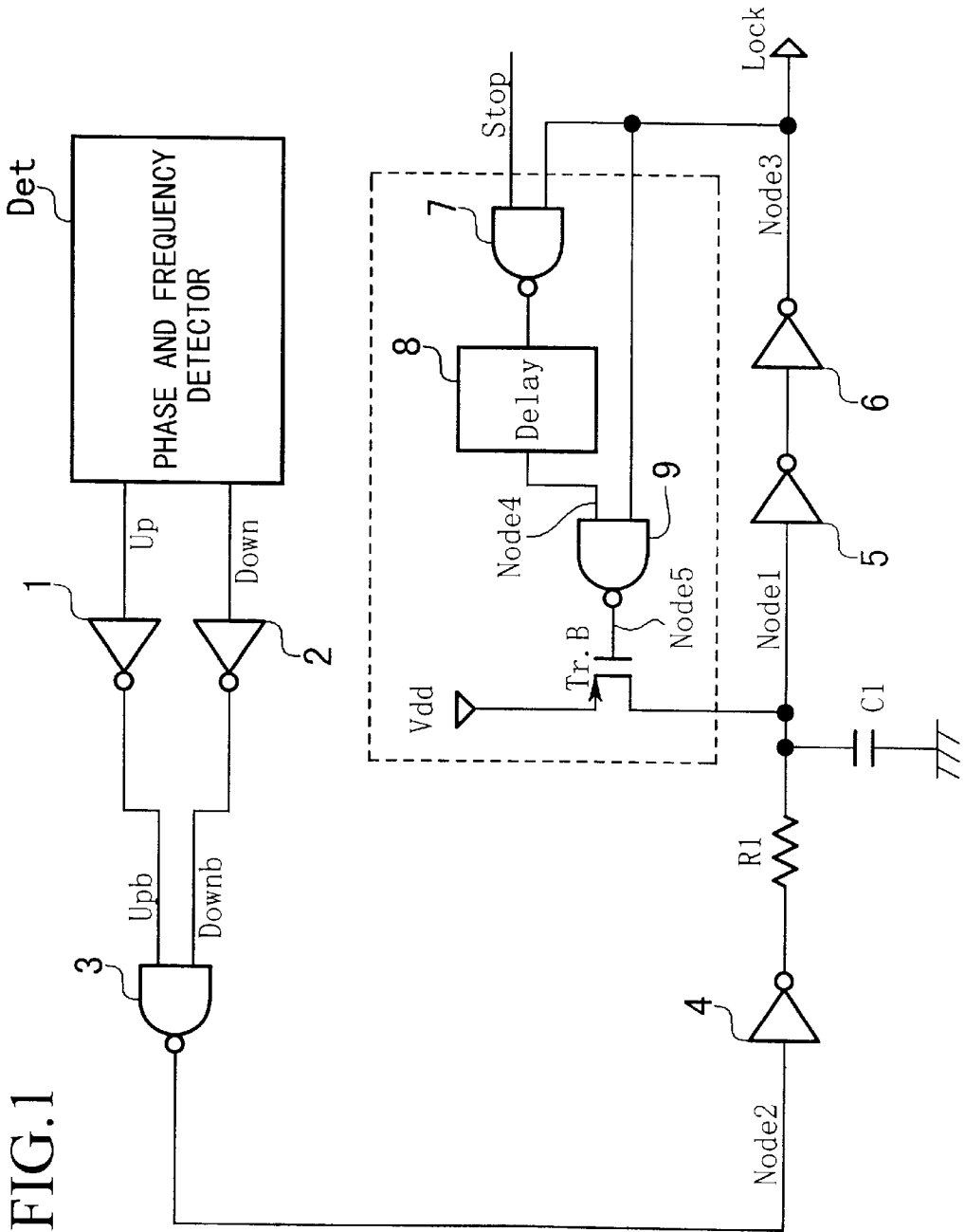
FIG. 1 is a circuit diagram showing the first embodiment of the lock determination circuit of a PLL according to the present invention.
Figure 2:
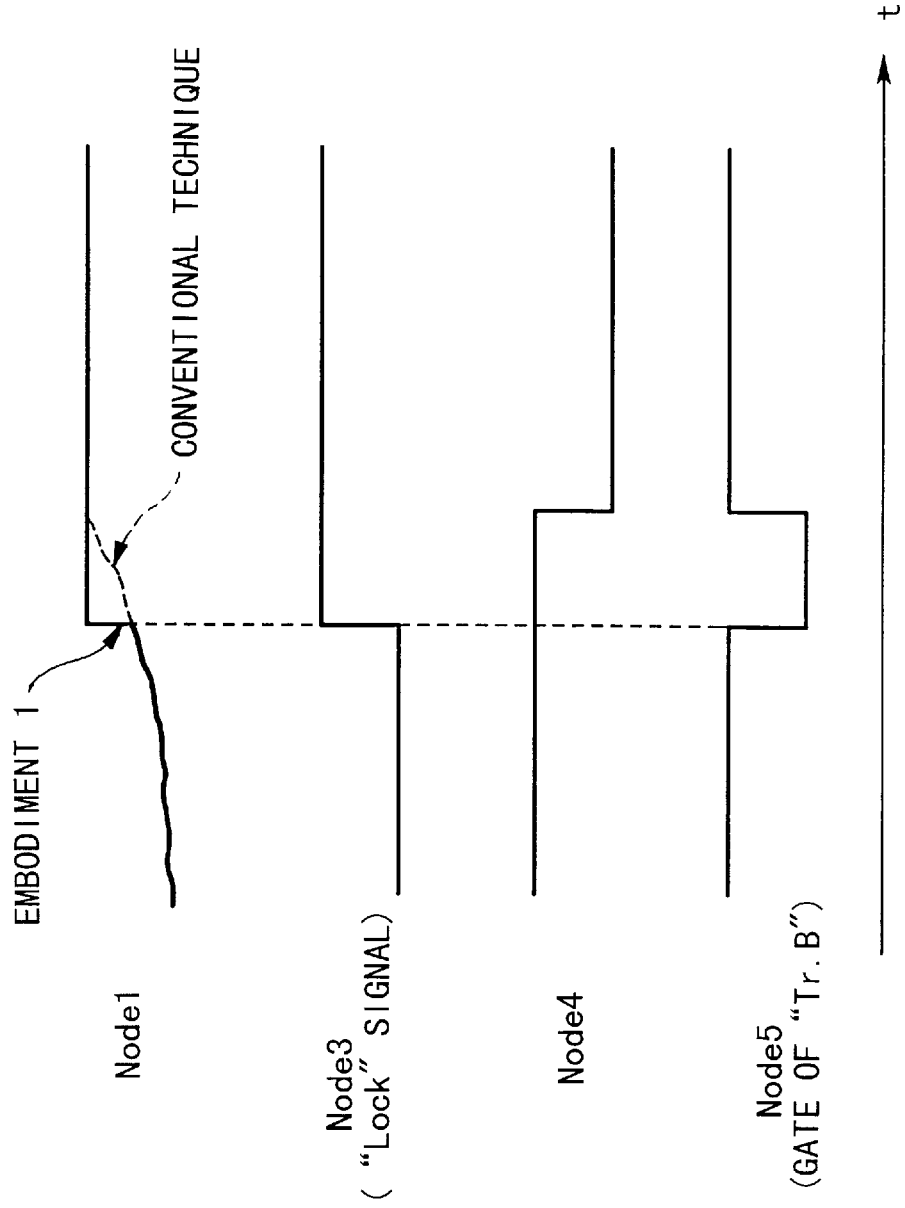
FIG. 2 is a timing chart showing the operation of the lock determination circuit of FIG. 1.

FIG. 1 is a circuit diagram showing the first embodiment of the lock determination circuit of a PLL. FIG. 2 is a timing chart showing the operation of the lock determination circuit (of a PLL) of the first embodiment.

Figure 5:
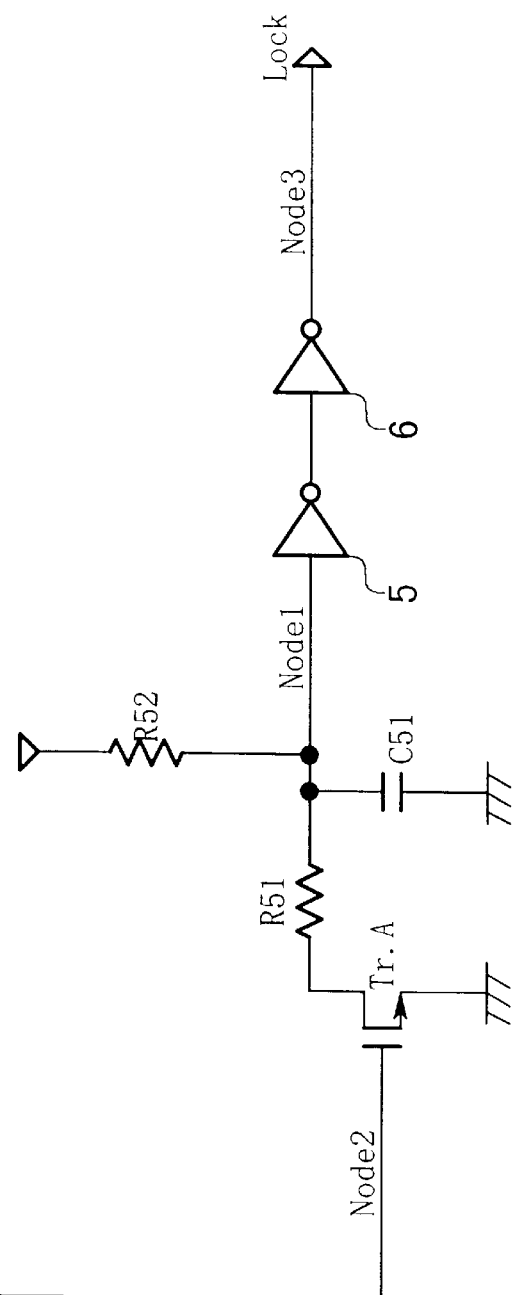
FIG. 5 is a circuit diagram showing a conventional lock determination circuit of a PLL.

In FIG. 1, parts corresponding to those in FIG. 5 (showing the conventional circuit) are given identical reference numerals.

The substantial difference in FIG. 1 in comparison with FIG. 5 is to provide a pull-up transistor "Tr.B" (strength: High), and add gates 7 and 9 for controlling the switching (i.e., the ON/OFF state) of transistor "Tr.B" and delay circuit "Delay" 8.

After the power supply is activated, in the PLL, a High-level signal is output via the "Up" output terminal of the phase and frequency detector Det. In this process, the level of Node 2 is High while the level of Node 1 is Low.

As the target phase and frequency gradually follow the reference clock signal, the High-level Up signal is output in fragments, and the High-level period of Node 2 is gradually reduced, and the electric potential of Node 1 gradually rises according to the speed calculated by the High-level width of Node 2 and the time constant R1×C1.

When the electric potential of Node 1 becomes Vdd/2, the level of electric potential of Node 3 becomes High via inverters 5 and 6, and the "Lock" signal (indicating that the lock state is realized) is output.

A signal due to the electric potential of Node 3 and another signal which is also sent from Node 3 but delayed via gate 7 and delay circuit 8 are input into gate 9 (see FIG. 1). After Node 3 is inverted to the High level, the gate input of transistor "Tr.B" maintains the Low level during the delay period of delay circuit 8 so that the electric potential of Node 1 is raised to the level Vdd at one stroke.

After the delay period is over, the input potential of transistor "Tr.B" is returned to the High level, that is, the next target of the circuit is to determine the unlock state and Node 1 is free.

If a pull-down transistor is also provided in the above structure (having the pull-up transistor "Tr.B"), the reduction of current (flowing through the relevant gate) can also be realized when the unlock state is next determined after the lock state is realized.

In addition, the time constant of Node 1 of FIG. 1 can be optimized for both the pull-up and pull-down sides with respect to inverter 4, thereby further efficiently reducing the current flowing through the relevant gate.

In the timing chart (of FIG. 2) showing each node in the operation, the variation of the electric potential of Node 1 is shown by the solid line, that is, it is pulled up when the Lock signal (corresponding to Node 3) is output. Here, the dotted line related to Node 1 shows a typical example of the electric-potential variation observed in the conventional operation.

Figure 3:
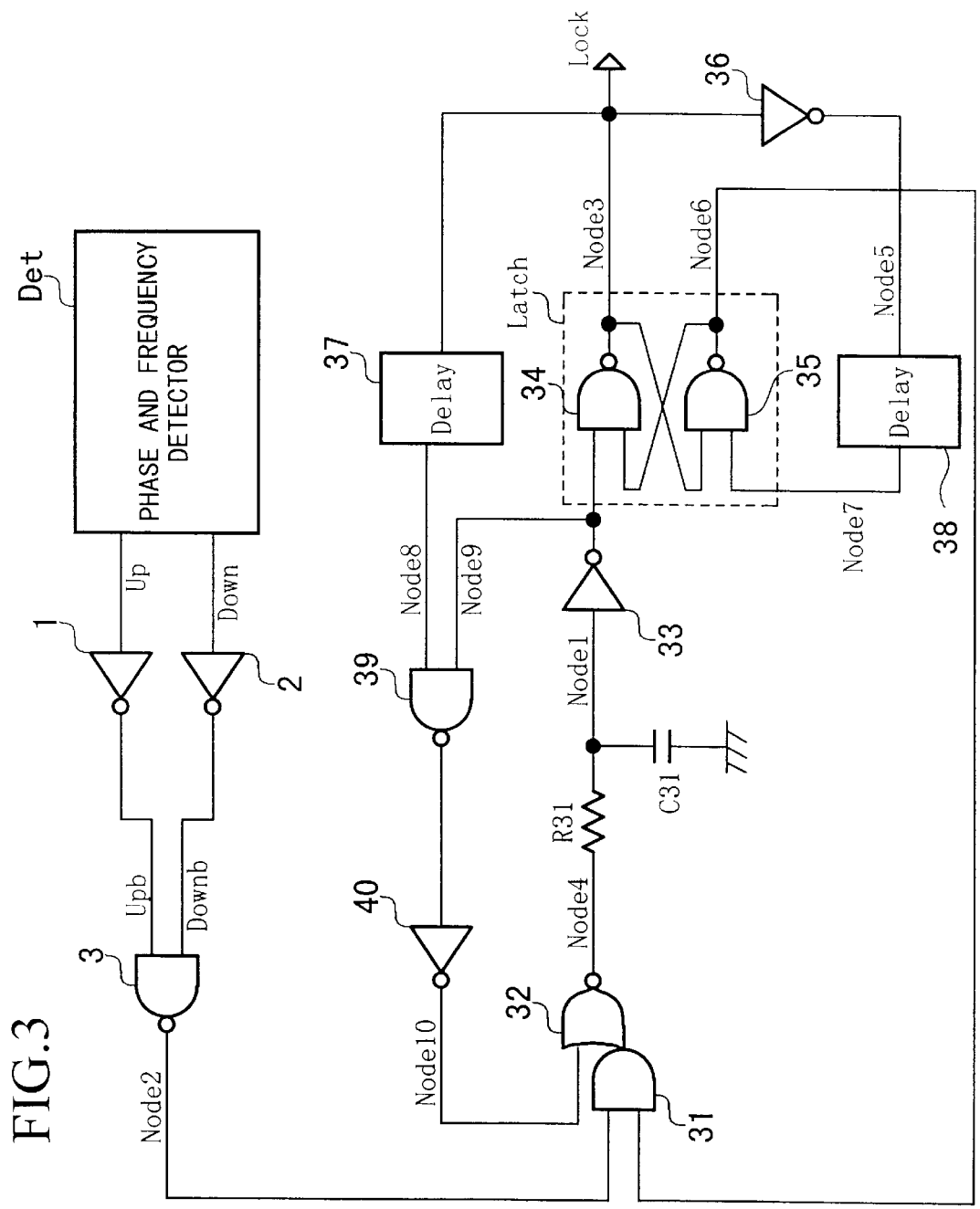
FIG. 3 is a circuit diagram showing the second embodiment of the lock determination circuit of a PLL according to the present invention.
Figure 4:
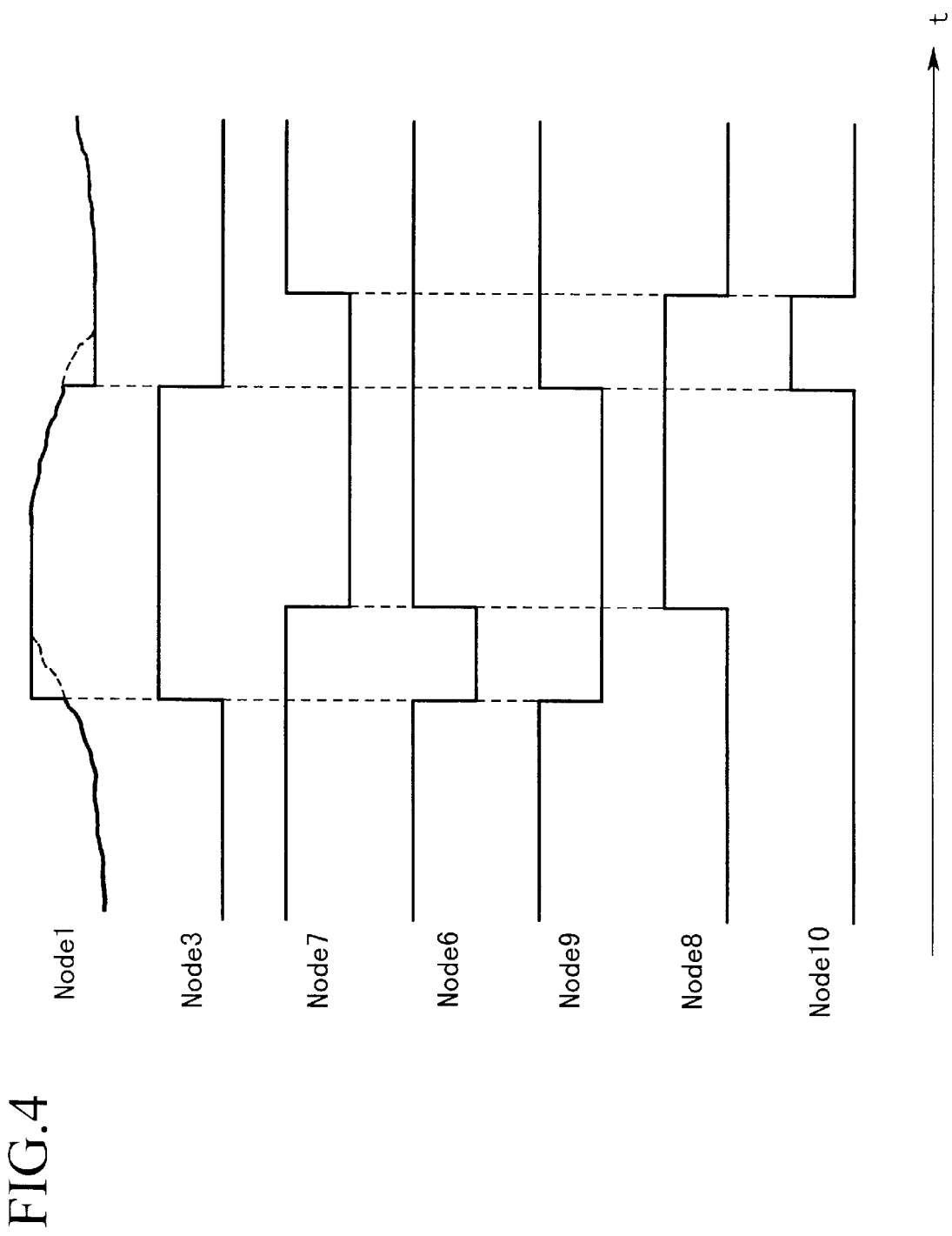
FIG. 4 is a timing chart showing the operation of the lock determination circuit of FIG. 3.

FIG. 3 shows the second embodiment of the lock determination circuit of a PLL according to the present invention. FIG. 4 is a timing chart showing the operation of the lock determination circuit of FIG. 3.

The operation of the second embodiment will be explained by observing the transition of each state from the time immediately after the power supply is activated.

First, immediately after the power supply is activated, Node 2 in FIG. 3 almost always outputs a High-level signal according to the Up signal output from the phase and frequency detector Det. In this process, the Lock terminal (i.e., Node 3) has the Low level, and thus Node 8 also has the Low level. In contrast, Node 9 has the High level so that Node 2 and Node 4 are physically connected via combined gates 31 and 32. Therefore, Node 2 is currently connected to resistor R31.

As time elapses, the phase and frequency of the comparison clock gradually come to agree with those of the reference clock, and the electric potential of Node 1 gradually rises. When the electric potential of Node 1 exceeds Vdd/2, the level of Node 9 becomes Low, and the level of Node 3, the output of a latch consisting of gates 34 and 35, becomes High, while the level of Node 6 is first Low for a delay period according to the input "Node 7" whose level changes with a delay caused by delay circuit 38, and the level of Node 6 then returns to High.

In the above Low-level period, Node 1 is raised to the High level by a force (for raising the electric potential of Node 1) acting via the combined gates 31 and 32 (here, the strength of the Node 6 side is higher than that of the Node 1 side), and after a predetermined period, the level of Node 6 becomes High and the above force becomes ineffective.

The output of gate 39 is unchanged and maintains the High level, so that gate 32 is still open.

When the lock state is terminated, the phase and frequency detector starts to output the Up or Down signal (accordingly, the unlock state is determined) and the electric potential of Node 1 begins to gradually decrease.

When the electric potential of Node 1 becomes Vdd/2, the level of Node 9 becomes High, the level of Node 5 becomes Low, while the High level of Node 6 is maintained.

In addition, according to delay circuit 37, the output of gate 39 is maintained Low for the delay period so that gate 32 is set to the "Disable" state for a specific period, and the electric potential of Node 1 suddenly falls to the Gnd (ground) level (here, the strength of the Node 10 side is higher than that of the Node 1 side).

Gate 32 immediately becomes effective, so that the initial state reappears.

In the timing chart of FIG. 4, the variation of the electric potential of Node 1 is shown by the solid line, and the dotted lines of Node 1 show a typical example of the corresponding variation in the conventional case. The electric potential of each other node is also shown in FIG. 4. The variation shown in this timing chart includes both the lock and unlocked operations.

As shown by FIG. 4, the transition duration corresponding to the intermediate potential of Node 1 can also be reduced in the second embodiment.

The first and second embodiments have been explained in detail with reference to the drawings. However, the present invention is not limited to these embodiments and various design modifications are possible within the spirit and scope of the present invention.

What is claimed is:

1. A lock determination circuit of a PLL (phase-locked loop), said PLL including a phase and frequency detector for comparing a reference signal and a comparison signal and outputting a detection pulse signal according to a difference between the reference and comparison signals, said lock determination circuit determining a lock state of an input signal to the PLL based on the detection pulse signal said lock determination circuit comprising:

a lock determination gate whose input level has an intermediate electric potential for a period after the lock state is determined; and a pull-up circuit which immediately pulls up the input level of the lock determination gate by an intermediate potential after the lock state is determined, so as to reduce a current flowing through the lock determination gate.

2. A lock determination circuit of a PLL (phase-locked loop), said PLL including a phase and frequency detector for comparing a reference signal and a comparison signal and outputting a detection pulse signal according to a difference between the reference and comparison signals, said lock determination circuit determining a lock state of an input signal to the PLL based on the detection pulse signal said lock determination circuit comprising:

a lock determination gate whose input level has an intermediate electric potential for a period after the lock state is determined; and a pull-up circuit which pulls up the input level of the lock determination gate after the lock state is determined, so as to reduce a current flowing through the lock determination gate, wherein the pull-up circuit includes a pull-up transistor and a delay circuit, wherein:

the delay circuit is activated when the lock state is determined; and the pull-up circuit pulls up the input level of the lock determination gate by setting the pull-up transistor to the ON state for a predetermined period by using the delay circuit.

3. A lock determination circuit of a PLL (phase-locked loop), said PLL including a phase and frequency detector for comparing a reference signal and a comparison signal and outputting a detection pulse signal according to a difference between the reference and comparison signals, said lock determination circuit determining a lock state of an input signal to the PLL based on the detection pulse signal said lock determination circuit comprising:

a lock determination gate whose input level has an intermediate electric potential for a period after the lock state is determined; and a pull-up circuit which pulls up the input level of the lock determination gate after the lock state is determined, so as to reduce a current flowing through the lock determination gate, wherein the pull-up circuit includes a first delay circuit activated when the lock state is determined and a latch, wherein the pull-up circuit pulls up the input level of the lock determination gate for a predetermined period by using the first delay circuit and the latch, and wherein the lock determination circuit further includes:

a pull-down circuit which includes a second delay circuit activated when an unlock state is determined and a latch, wherein the input level of the lock determination gate is pulled down for a predetermined period by using the second delay circuit and the latch.

* * * * *